United States Patent
Cleary et al.

(10) Patent No.: US 10,759,147 B2
(45) Date of Patent: Sep. 1, 2020

(54) LAMINATED GLASS ARTICLE AND METHOD FOR FORMING THE SAME

(71) Applicant: CORNING INCORPORATED, Corning, NY (US)

(72) Inventors: Thomas Michael Cleary, Elmira, NY (US); Sinue Gomez, Corning, NY (US); Guangli Hu, Berkeley Heights, NJ (US); Robert Anthony Schaut, Horseheads, NY (US); Charlene Marie Smith, Corning, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/504,051

(22) Filed: Jul. 5, 2019

(65) Prior Publication Data

US 2020/0001575 A1  Jan. 2, 2020

Related U.S. Application Data

(62) Division of application No. 15/309,055, filed as application No. PCT/US2015/029671 on May 7, 2015, now Pat. No. 10,399,304.

(Continued)

(51) Int. Cl.
*B32B 17/06* (2006.01)
*C03B 23/02* (2006.01)
(Continued)

(52) U.S. Cl.
CPC ............... *B32B 17/06* (2013.01); *B32B 7/02* (2013.01); *C03B 17/02* (2013.01); *C03B 17/064* (2013.01); *C03B 23/02* (2013.01); *C03C 3/083* (2013.01); *C03C 3/087* (2013.01); *C03C 3/091* (2013.01); *C03C 3/093* (2013.01); *C03C 3/097* (2013.01);
(Continued)

(58) Field of Classification Search
USPC .................................. 428/426, 428, 432, 688
See application file for complete search history.

(56) References Cited

U.S. PATENT DOCUMENTS 3,737,294 A * 6/1973 Dumbaugh, Jr. et al. ...................
C03B 23/203
65/33.9
3,746,526 A 7/1973 Giffon
(Continued)

FOREIGN PATENT DOCUMENTS

CN 102361832 A 2/2012
EP 2623470 A1 8/2013
(Continued)

OTHER PUBLICATIONS

English Translation of CN201580024008.4 First Office Action dated Sep. 3, 2018; 13 Pages; Chinese Patent Office.
(Continued)

*Primary Examiner* — Lauren R Colgan
(74) *Attorney, Agent, or Firm* — Svetlana Z. Short

(57) ABSTRACT

A glass article includes a glass core layer and a glass cladding layer adjacent to the core layer. An average coefficient of thermal expansion (CTE) of the core layer is greater than an average CTE of the cladding layer. An effective $10^{9.9}$ P temperature of the glass article is at most about 750° C.

7 Claims, 6 Drawing Sheets

Related U.S. Application Data

(60) Provisional application No. 61/989,704, filed on May 7, 2014.

(51) Int. Cl.

| | | |
|---|---|---|
| *C03B 17/02* | (2006.01) | |
| *C03B 17/06* | (2006.01) | |
| *C03C 3/087* | (2006.01) | |
| *C03C 3/091* | (2006.01) | |
| *C03C 3/093* | (2006.01) | |
| *C03C 3/097* | (2006.01) | |
| *B32B 7/02* | (2019.01) | |
| *C03C 3/083* | (2006.01) | |
| *H05K 1/03* | (2006.01) | |
| *H05K 1/09* | (2006.01) | |

(52) U.S. Cl.
CPC ............ *H05K 1/0306* (2013.01); *H05K 1/092* (2013.01); *B32B 2457/20* (2013.01); *B32B 2457/202* (2013.01); *B32B 2457/208* (2013.01)

(56) References Cited

U.S. PATENT DOCUMENTS

| | | | |
|---|---|---|---|
| 3,849,097 A * | 11/1974 | Giffen | C03C 10/00 |
| | | | 65/33.5 |
| 3,931,438 A | 1/1976 | Beall et al. | |
| 4,102,664 A | 7/1978 | Dumbaugh | |
| 4,214,886 A | 7/1980 | Shay et al. | |
| 4,381,932 A | 5/1983 | Olson et al. | |
| 4,457,771 A | 7/1984 | Ambrogi | |
| 4,479,819 A | 10/1984 | Borelli et al. | |
| 4,735,855 A | 4/1988 | Wofford et al. | |
| 4,880,453 A | 11/1989 | Coppola et al. | |
| 5,100,452 A | 3/1992 | Dumbaugh | |
| 5,342,426 A * | 8/1994 | Dumbaugh, Jr. | C03C 17/02 |
| | | | 65/23 |
| 5,559,060 A | 9/1996 | Dumbaugh, Jr. et al. | |
| 6,511,615 B1 | 1/2003 | Dawes et al. | |
| 7,201,965 B2 * | 4/2007 | Gulati | C03B 33/02 |
| | | | 428/426 |
| 7,514,149 B2 | 4/2009 | Bocko et al. | |
| 8,007,913 B2 | 8/2011 | Coppola et al. | |
| 8,586,492 B2 | 11/2013 | Barefoot et al. | |
| 9,346,705 B2 * | 5/2016 | Kiczenski | B32B 17/00 |
| 9,701,570 B2 | 7/2017 | Mauro et al. | |
| 9,902,138 B2 | 2/2018 | Edwards | |
| 10,077,208 B2 * | 9/2018 | Amosov | C03C 21/002 |
| 10,202,303 B2 * | 2/2019 | Boek | C03C 10/0027 |
| 2006/0127679 A1 | 6/2006 | Gulati et al. | |
| 2010/0035038 A1 | 2/2010 | Barefoot et al. | |
| 2011/0045961 A1 | 2/2011 | Dejneka et al. | |
| 2011/0192525 A1 | 8/2011 | Kondo et al. | |
| 2011/0200805 A1 * | 8/2011 | Tomamoto | C03B 23/203 |
| | | | 428/213 |
| 2011/0318555 A1 * | 12/2011 | Bookbinder | C03C 3/083 |
| | | | 428/213 |
| 2012/0052271 A1 | 3/2012 | Gomez et al. | |
| 2012/0058311 A1 | 3/2012 | Shimomura et al. | |
| 2012/0114901 A1 | 5/2012 | Uraji et al. | |
| 2012/0202010 A1 | 8/2012 | Uchida | |
| 2013/0004758 A1 | 1/2013 | Dejneka et al. | |
| 2013/0015180 A1 | 1/2013 | Godard et al. | |
| 2013/0101853 A1 | 4/2013 | Drake et al. | |
| 2013/0236666 A1 | 9/2013 | Bookbinder et al. | |
| 2014/0065374 A1 | 3/2014 | Tsuchiya et al. | |
| 2014/0141217 A1 * | 5/2014 | Gulati | C03B 17/02 |
| | | | 428/212 |
| 2014/0227523 A1 | 8/2014 | Dejneka et al. | |
| 2014/0242375 A1 * | 8/2014 | Mauro | C03B 17/064 |
| | | | 428/312.6 |
| 2015/0030827 A1 * | 1/2015 | Gomez | C03C 21/002 |
| | | | 428/212 |
| 2015/0037552 A1 * | 2/2015 | Mauro | C03C 3/089 |
| | | | 428/212 |
| 2015/0051060 A1 | 2/2015 | Ellison et al. | |

FOREIGN PATENT DOCUMENTS

| | | |
|---|---|---|
| JP | 64024050 A | 1/1989 |
| JP | 2011093728 A | 5/2011 |
| WO | 2013006301 A1 | 1/2013 |
| WO | 2013016157 A1 | 1/2013 |
| WO | 2013130700 A1 | 9/2013 |
| WO | 2013130718 A1 | 9/2013 |
| WO | 2013181505 A1 | 12/2013 |
| WO | 2014015840 A1 | 1/2014 |
| WO | 2014201320 A1 | 12/2014 |

OTHER PUBLICATIONS

International Search Report and Written Opinion of the International Searching Authority; PCT/US2015/029671; dated Jul. 15, 2015; 14 Pages; European Patent Office.

Machine Translation of JP2016565694 Office Action dated May 29, 2019; 5 Pages, Japanese Patent Office.

* cited by examiner

LAMINATED GLASS ARTICLE AND METHOD FOR FORMING THE SAME

This application is a divisional of U.S. patent application Ser. No. 15/309,055 filed on May 7, 2015 which claims the benefit of priority under 35 U.S.C. § 371 of International Application No. PCT/US2015/029671 filed May 7, 2015, which claims the benefit of priority to U.S. Application No. 61/989,704 filed May 7, 2014 the content of each of which is incorporated herein by reference in its entirety.

BACKGROUND

1. Field

This disclosure relates to glass articles, and more particularly to laminated glass articles comprising a plurality of glass layers and methods for forming the same.

2. Technical Background

A glass article can be molded to form a shaped glass article having a non-planar or 3-dimensional shape. Typically, a glass article is heated to its softening point and then deformed to conform to the surface of a solid mold.

SUMMARY

Disclosed herein are laminated glass articles and methods for forming the same.

Disclosed herein is a glass article comprising a glass core layer and a glass cladding layer adjacent to the core layer. An average coefficient of thermal expansion (CTE) of the core layer is greater than an average CTE of the cladding layer. An effective $10^{9.9}$ P temperature of the glass article is at most about 750° C.

Also disclosed herein is a method comprising contacting a glass sheet with a forming surface to form a shaped glass article. The glass sheet comprises a glass core layer and a glass cladding layer adjacent to the core layer. An average coefficient of thermal expansion (CTE) of the core layer is greater than an average CTE of the cladding layer. An effective $10^{9.9}$ P temperature of the glass sheet is at most about 750° C.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
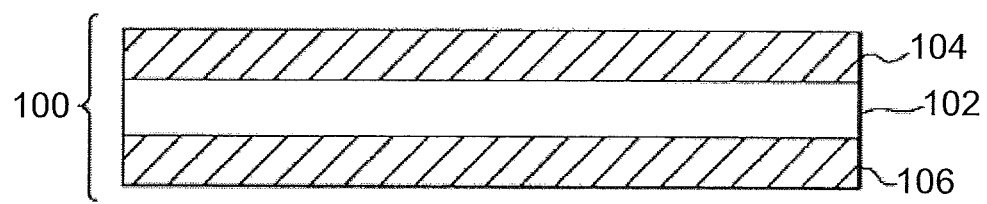
FIG. 1 is a cross-sectional view of one exemplary embodiment of a glass article.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

As used herein, the term "average coefficient of thermal expansion" refers to the average coefficient of thermal expansion of a given material or layer between 0° C. and 300° C. As used herein, the term "coefficient of thermal expansion" refers to the average coefficient of thermal expansion unless otherwise indicated.

As used herein, the term "strength profile" refers to the strength of a glass article determined after introduction of flaws into an outer surface of the glass article as a function of flaw size. In some embodiments, the strength of the glass article is presented as failure load, which is a measure of the rigidity of the glass article up to catastrophic failure. In other embodiments, the strength of the glass article is presented as retained strength, which is based on the failure load normalized by the thickness of the glass article. The flaw size comprises the depth of the flaw measured from the outer surface of the glass, which can be determined using fractography analysis.

As used herein, the term "$10^{9.9}$ P temperature" of a glass composition, a glass layer, or a glass article refers to the temperature at which the glass composition, glass layer, or glass article has a viscosity of about $10^{9.9}$ Poise (P).

In various embodiments, a glass article comprises at least a first layer and a second layer. For example, the first layer comprises a core layer, and the second layer comprises one or more cladding layers adjacent to the core layer. The first layer and/or the second layer are glass layers comprising a glass, a glass-ceramic, or a combination thereof. In some embodiments, the first layer and/or the second layer are transparent glass layers. The glass article can comprise a glass sheet or a shaped glass article comprising a suitable 3-dimensional (3D) shape. In some embodiments, a glass sheet can be formed into a shaped glass article. An average coefficient of thermal expansion (CTE) of the first layer is greater than an average CTE of the second layer. Such a CTE mismatch can aid in strengthening the glass article. An effective $10^{9.9}$ Poise (P) temperature of the glass article is at most about 750° C. Such a relatively low effective $10^{9.9}$ P temperature can enable forming of glass articles having various 3D shapes.

FIG. 1 is a cross-sectional view of one exemplary embodiment of a glass article 100. In some embodiments, glass article 100 comprises a laminated sheet comprising a plurality of glass layers. The laminated sheet can be substantially planar as shown in FIG. 1 or non-planar. In other embodiments, the glass article comprises a shaped glass article. For example, the laminated sheet contacted with a forming surface of a mold to form the shaped glass article. Glass article 100 comprises a core layer 102 disposed between a first cladding layer 104 and a second cladding layer 106. In some embodiments, first cladding layer 104 and second cladding layer 106 are exterior layers as shown in FIG. 1. In other embodiments, the first cladding layer and/or the second cladding layer are intermediate layers disposed between the core layer and an exterior layer.

Core layer 102 comprises a first major surface and a second major surface opposite the first major surface. In some embodiments, first cladding layer 104 is fused to the first major surface of core layer 102. Additionally, or alternatively, second cladding layer 106 is fused to the second major surface of core layer 102. In such embodiments, the interfaces between first cladding layer 104 and core layer 102 and/or between second cladding layer 106 and core layer 102 are free of any bonding material such as, for example, a polymer interlayer, an adhesive, a coating layer, or any non-glass material added or configured to adhere the respective cladding layers to the core layer. Thus, first cladding layer 104 and/or second cladding layer 106 are fused directly to core layer 102 or are directly adjacent to core layer 102. In some embodiments, the glass article comprises one or more intermediate layers disposed between the core layer and the first cladding layer and/or between the core layer and the second cladding layer. For example, the intermediate layers comprise intermediate glass layers and/or diffusion layers formed at the interface of the core layer and the cladding layer. The diffusion layer can comprise a blended region comprising components of each layer adjacent to the diffusion layer. In some embodiments, glass sheet 100 comprises a glass-glass laminate (e.g., an in situ fused multilayer glass-glass laminate) in which the interfaces between directly adjacent glass layers are glass-glass interfaces.

In some embodiments, core layer 102 comprises a first glass composition, and first and/or second cladding layers 104 and 106 comprise a second glass composition that is different than the first glass composition. For example, in the embodiment shown in FIG. 1, core layer 102 comprises the first glass composition, and each of first cladding layer 104 and second cladding layer 106 comprises the second glass composition. In other embodiments, the first cladding layer comprises the second glass composition, and the second cladding layer comprises a third glass composition that is different than the first glass composition and/or the second glass composition.

Figure 2:
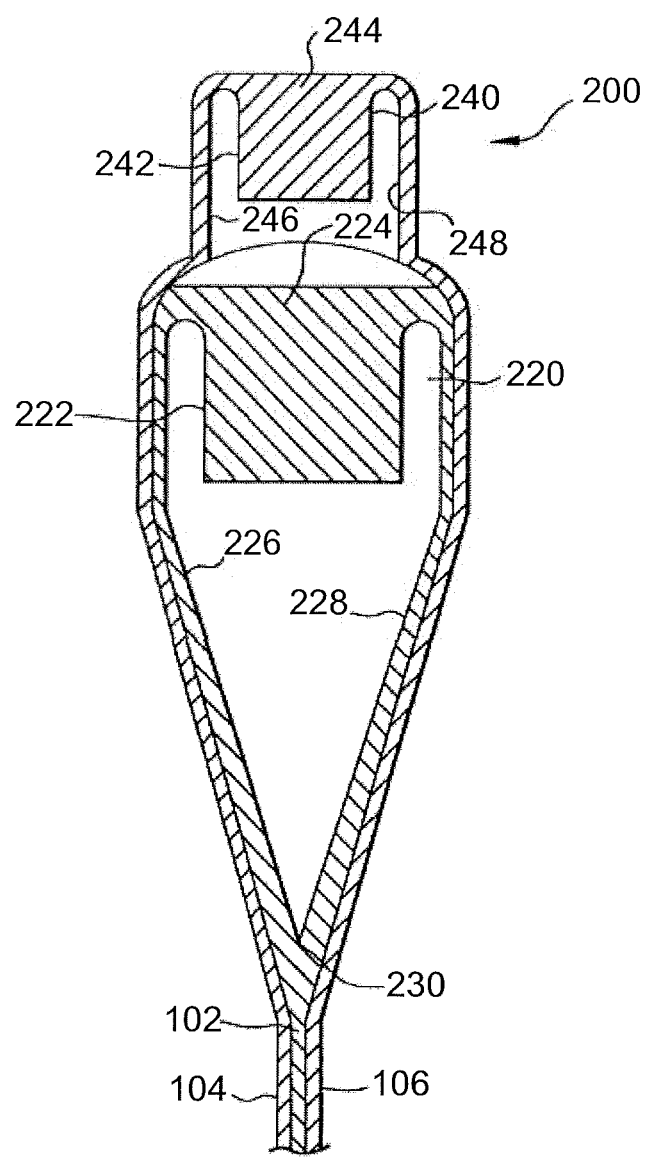
FIG. 2 is a cross-sectional view of one exemplary embodiment of an overflow distributor that can be used to form a glass article.

The glass article can be formed using a suitable process such as, for example, a fusion draw, down draw, slot draw, up draw, or float process. In some embodiments, the glass article is formed using a fusion draw process. FIG. 2 is a cross-sectional view of one exemplary embodiment of an overflow distributor 200 that can be used to form a glass article such as, for example, glass article 100. Overflow distributor 200 can be configured as described in U.S. Pat. No. 4,214,886, which is incorporated herein by reference in its entirety. For example, overflow distributor 200 comprises a lower overflow distributor 220 and an upper overflow distributor 240 positioned above the lower overflow distributor. Lower overflow distributor 220 comprises a trough 222. A first glass composition 224 is melted and fed into trough 222 in a viscous state. First glass composition 224 forms core layer 102 of glass article 100 as further described below. Upper overflow distributor 240 comprises a trough 242. A second glass composition 244 is melted and fed into trough 242 in a viscous state. Second glass composition 244 forms first and second cladding layers 104 and 106 of glass article 100 as further described below.

First glass composition 224 overflows trough 222 and flows down opposing outer forming surfaces 226 and 228 of lower overflow distributor 220. Outer forming surfaces 226 and 228 converge at a draw line 230. The separate streams of first glass composition 224 flowing down respective outer forming surfaces 226 and 228 of lower overflow distributor 220 converge at draw line 230 where they are fused together to form core layer 102 of glass article 100.

Second glass composition 244 overflows trough 242 and flows down opposing outer forming surfaces 246 and 248 of upper overflow distributor 240. Second glass composition 244 is deflected outward by upper overflow distributor 240 such that the second glass composition flows around lower overflow distributor 220 and contacts first glass composition 224 flowing over outer forming surfaces 226 and 228 of the lower overflow distributor. The separate streams of second glass composition 244 are fused to the respective separate streams of first glass composition 224 flowing down respective outer forming surfaces 226 and 228 of lower overflow distributor 220. Upon convergence of the streams of first glass composition 224 at draw line 230, second glass composition 244 forms first and second cladding layers 104 and 106 of glass article 100.

In some embodiments, first glass composition 224 of core layer 102 in the viscous state is contacted with second glass composition 244 of first and second cladding layers 104 and 106 in the viscous state to form the laminated sheet. In some of such embodiments, the laminated sheet is part of a glass ribbon traveling away from draw line 230 of lower overflow distributor 220 as shown in FIG. 2. The glass ribbon can be drawn away from lower overflow distributor 220 by a suitable means including, for example, gravity and/or pulling rollers. The glass ribbon cools as it travels away from lower overflow distributor 220. The glass ribbon is severed to separate the laminated sheet therefrom. Thus, the laminated sheet is cut from the glass ribbon. The glass ribbon can be severed using a suitable technique such as, for example, scoring, bending, thermally shocking, and/or laser cutting. In some embodiments, glass article 100 comprises the laminated sheet as shown in FIG. 1. In other embodiments, the laminated sheet can be processed further (e.g., by cutting or molding) to form glass article 100.

Although glass article 100 shown in FIG. 1 comprises three layers, other embodiments are included in this disclosure. In other embodiments, a glass article can have a determined number of layers, such as two, four, or more layers. For example, a glass article comprising two layers can be formed using two overflow distributors positioned so that the two layers are joined while traveling away from the respective draw lines of the overflow distributors or using a single overflow distributor with a divided trough so that two glass compositions flow over opposing outer forming surfaces of the overflow distributor and converge at the draw line of the overflow distributor. A glass article comprising four or more layers can be formed using additional overflow distributors and/or using overflow distributors with divided troughs. Thus, a glass article having a determined number of layers can be formed by modifying the overflow distributor accordingly.

In some embodiments, glass article 100 comprises a thickness of at least about 0.05 mm, at least about 0.1 mm, at least about 0.2 mm, or at least about 0.3 mm. Additionally, or alternatively, glass article 100 comprises a thickness of at most about 3 mm, at most about 2 mm, at most about 1.5 mm, at most about 1 mm, at most about 0.7 mm, or at most about 0.5 mm. For example, glass article comprises a thickness of from about 0.2 mm to about 3 mm, from about 1 mm to about 3 mm, or from about 1.5 mm to about 2.5 mm. In some embodiments, a ratio of a thickness of core layer 102 to a thickness of glass article 100 is at least about 0.7, at least about 0.8, at least about 0.85, at least about 0.9, or at least about 0.95. In some embodiments, a thickness of the second layer (e.g., each of first cladding layer 104 and second cladding layer 106) is from about 0.01 mm to about 0.3 mm.

In some embodiments, glass article 100 is configured as a strengthened glass article. For example, in some embodiments, the second glass composition of first and/or second cladding layers 104 and 106 comprises a different average coefficient of thermal expansion (CTE) than the first glass composition of core layer 102. For example, first and second cladding layers 104 and 106 are formed from a glass composition having a lower average CTE than core layer 102. The CTE mismatch (i.e., the difference between the average CTE of first and second cladding layers 104 and 106 and the average CTE of core layer 102) results in formation of compressive stress in the cladding layers and tensile stress in the core layer upon cooling of glass article 100. In various embodiments, each of the first and second cladding layers, independently, can have a higher average CTE, a lower average CTE, or substantially the same average CTE as the core layer.

In some embodiments, the average CTE of core layer 102 and the average CTE of first and/or second cladding layers 104 and 106 differ by at least about $5 \times 10^{-7}$ $°C.^{-1}$, at least about $15 \times 10^{-7}$ $°C.^{-1}$, at least about $25 \times 10^{-7}$ $°C.^{-1}$, or at least about $30 \times 10^{-7}$ $°C.^{-1}$. Additionally, or alternatively, the average CTE of core layer 102 and the average CTE of first and/or second cladding layers 104 and 106 differ by at most about $100 \times 10^{-7}$ $°C.^{-1}$, at most about $75 \times 10^{-7}$ $°C.^{-1}$, at most about $50 \times 10^{-7}$ $°C.^{-1}$, at most about $40 \times 10^{-7}$ $°C.^{-1}$, at most about $30 \times 10^{-7}$ $°C.^{-1}$, at most about $20 \times 10^{-7}$ $°C.^{-1}$, or at most about $10 \times 10^{-7}$ $°C.^{-1}$. In some embodiments, the second glass composition of first and/or second cladding layers 104 and 106 comprises an average CTE of at most about $66 \times 10^{-7}$ $°C.^{-1}$, at most about $55 \times 10^{-7}$ $°C.^{-1}$, at most about $50 \times 10^{-7}$ $°C.^{-1}$, at most about $40 \times 10^{-7}$ $°C.^{-1}$, or at most about $35 \times 10^{-7}$ $°C.^{-1}$. Additionally, or alternatively, the second glass composition of first and/or second cladding layers 104 and 106 comprises an average CTE of at least about $25 \times 10^{-7}$ $°C.^{-1}$, or at least about $30 \times 10^{-7}$ $°C.^{-1}$. Additionally, or alternatively, the first glass composition of core layer 102 comprises an average CTE of at least about $40 \times 10^{-7}$ $°C.^{-1}$, at least about $50 \times 10^{-7}$ $°C.^{-1}$, at least about $55 \times 10^{-7}$ $°C.^{-1}$, at least about $65 \times 10^{-7}$ $°C.^{-1}$, at least about $70 \times 10^{-7}$ $°C.^{-1}$, at least about $80 \times 10^{-7}$ $°C.^{-1}$, or at least about $90 \times 10^{-7}$ $°C.^{-1}$. Additionally, or alternatively, the first glass composition of core layer 102 comprises an average CTE of at most about $110 \times 10^{-7}$ $°C.^{-1}$, at most about $100 \times 10^{-7}$ $°C.^{-1}$, at most about $90 \times 10^{-7}$ $°C.^{-1}$, at most about $75 \times 10^{-7}$ $°C.^{-1}$, or at most about $70 \times 10^{-7}$ $°C.^{-1}$.

In various embodiments, the relative thicknesses of the glass layers can be selected to achieve a glass article having desired strength properties. For example, in some embodiments, the first glass composition of core layer 102 and the second glass composition of first and/or second cladding layers 104 and 106 are selected to achieve a desired CTE mismatch, and the relative thicknesses of the glass layers are selected, in combination with the desired CTE mismatch, to achieve a desired compressive stress in the cladding layers and tensile stress in the core layer. Without wishing to be bound by any theory, it is believed that the strength profile of the glass article can be determined predominantly by the relative thicknesses of the glass layers and the compressive stress in the cladding layers, and that the breakage pattern of the glass article can be determined predominantly by the relative thicknesses of the glass layers and the tensile stress in the core layer. Thus, the glass compositions and relative thicknesses of the glass layers can be selected to achieve a glass article having a desired strength profile and/or breakage pattern. The glass article can have the desired strength profile and/or breakage pattern in an as-formed condition without additional processing (e.g., thermal tempering or ion-exchange treatment). For example, the as-formed glass sheet or shaped glass article can have an improved strength profile as compared to thermally tempered or ion-exchanged glass articles as described herein.

In some embodiments, the compressive stress of the cladding layers is at most about 800 MPa, at most about 500 MPa, at most about 350 MPa, or at most about 150 MPa. Additionally, or alternatively, the compressive stress of the cladding layers is at least about 10 MPa, at least about 20 MPa, at least about 30 MPa, at least about 50 MPa, or at least about 250 MPa. Additionally, or alternatively, the tensile stress of the core layer is at most about 150 MPa, or at most about 100 MPa. Additionally, or alternatively, the tensile stress of the core layer is at least about 5 MPa, at least about 10 MPa, at least about 25 MPa, or at least about 50 MPa.

In some embodiments, glass article 100 is configured as a durable glass article. For example, glass article 100 is resistant to degradation in response to exposure to a reagent. In some embodiments, the second glass composition of the first and/or second cladding layers 104 and 106 comprises a durable glass composition that is resistant to degradation in response to exposure to the reagent. In some embodiments, the glass article comprises a core enveloped within a cladding. For example, core layer 102 is enveloped within a cladding comprising first cladding layer 104 and second cladding layer 106 as shown in FIG. 1. In some of such embodiments, the first glass composition of core layer 102 comprises a non-durable glass composition that is non-resistant to degradation in response to exposure to the reagent. The durable cladding can aid in protecting the core from exposure to the reagent. In other embodiments, the first glass composition comprises a durable glass composition that is resistant to degradation in response to exposure to the reagent. Thus, because the core is enveloped within the cladding, the first glass composition of the core of the durable glass article can comprise a durable or non-durable glass composition.

In various embodiments, the reagent comprises, an acid, a base, or a combination thereof. In some embodiments, the reagent comprises an acid such as, for example, a mineral acid (e.g., HCl, $HNO_3$, $H_2SO_4$, $H_3PO_4$, $H_3BO_3$, HBr, $HClO_4$, or HF), a carboxylic acid (e.g., $CH_3COOH$), or a combination thereof. For example, in some embodiments, the reagent comprises HCl (e.g., 5 vol % aqueous HCl solution). Additionally, or alternatively, the reagent comprises $HNO_3$ (e.g., 1 M aqueous $HNO_3$ solution). Additionally, or alternatively, the reagent comprises $H_2SO_4$ (e.g., 0.02 N aqueous $H_2SO_4$ solution). In some embodiments, the reagent comprises a base such as, for example, LiOH, NaOH, KOH, RbOH, CsOH, $Ca(OH)_2$, $Sr(OH)_2$, $Ba(OH)_2$, or a combination thereof. In some embodiments, the reagent comprises a soap (e.g., potassium oleate), kerosene, an alcohol (e.g., undiluted denatured alcohol such as Formula SD No. 30, methyl alcohol, ethyl alcohol, and/or isopropanol), gasoline, an ether (e.g., a glycol ether such as glycol monomethyl ether), ammonia (e.g., ammonium hydroxide), water, or combinations thereof.

The chemical durability of a glass composition can be represented by a degradation rate of the glass composition in response to exposure to a reagent at a particular temperature for a particular period of time. The degradation rate can be expressed, for example, as mass of the sample lost per surface area of the sample. In some embodiments, a degradation rate of the second glass composition of first and/or second cladding layers 104 and 106 in response to exposure to a 5 vol % aqueous HCl solution at 95° C. for 6 h is at most about 0.018 mg/cm$^2$, at most about 0.009 mg/cm$^2$, or at most about 0.005 mg/cm$^2$. Additionally, or alternatively, a degradation rate of the second glass composition of first and/or second cladding layers 104 and 106 in response to exposure to a 1 M aqueous HNO$_3$ solution at 95° C. for 24 h is at most about 0.08 mg/cm$^2$, at most about 0.06 mg/cm$^2$, or at most about 0.03 mg/cm$^2$. Additionally, or alternatively, a degradation rate of the second glass composition of first and/or second cladding layers 104 and 106 in response to exposure to a 0.02 N aqueous H$_2$SO$_4$ solution at 95° C. for 24 h is at most about 0.04 mg/cm$^2$, at most about 0.02 mg/cm$^2$, or at most about 0.005 mg/cm$^2$. In other embodiments, chemical durability of a glass composition is determined as described in ANSI Z26.1, Test 19; RECE R43, Test A3/6; ISO 695; ISO 720; DIN 12116; each of which is incorporated by reference herein in its entirety; or a similar standard.

In some embodiments, glass article 100 is configured as a formable glass article. For example, glass article 100 is contacted with a forming surface of a forming unit to form a shaped glass article. Such a process can be referred to as a reforming process or a molding process. In some embodiments, glass article 100 comprises a substantially planar glass sheet, and the shaped glass article comprises a non-planar 3D shape. In other embodiments, the glass article comprises a non-planar 3D shape, and the shaped glass article comprises a different non-planar 3D shape. The forming unit can comprise a suitable mold including, for example, a vacuum mold, a pressure mold, a sagging mold, or a press mold. Glass article 100 is heated to a forming temperature that is sufficiently high that, in response to contacting the glass article at the forming temperature with the forming surface, the glass article is deformed. In some embodiments, glass article 100 is deformed to conform to the contour of the forming surface. Thus, the resulting formed glass article comprises a 3D shape that is complementary to the shape of the forming surface. In other embodiments, glass article 100 is deformed to sag into a void of the forming surface (e.g., a central void of a ring-shaped mold). Thus, the resulting formed glass article comprises a curved 3D shape sloping inward from the forming surface. The viscosity of glass article 100 at the forming temperature is low enough to allow viscous deformation to form the shaped glass article with the desired 3D shape (e.g., to achieve a sufficiently small bend radius). Thus, a relatively low viscosity at the forming temperature can aid in achieving a shaped glass article with the desired 3D shape. In some embodiments, the forming surface is coated with a coating material to reduce glass surface damage and/or mold degradation.

An effective $10^{9.9}$ P temperature $T_{9.9P,eff}$ of glass article 100 can be indicative of the formability of the glass article.

Effective $10^{9.9}$ P temperature $T_{9.9,Peff}$ of glass article 100 comprises a thickness weighted average $10^{9.9}$ P temperature of the glass article. For example, in some embodiments, core layer 102 comprises a thickness $t_{core}$, and each of first cladding layer 104 and second cladding layer 106 comprises a thickness $t_{clad}$. The first glass composition comprises a $10^{9.9}$ P temperature $T_{9.9P,core}$, and the second glass composition comprises a $10^{9.9}$ P temperature $T_{9.9P,clad}$. Thus, the effective $10^{9.9}$ P temperature of glass article 100 is represented by equation 1.

$$T_{9.9P,eff} = \frac{t_{core}T_{9.9P,core} + 2t_{clad}T_{9.9P,clad}}{t_{core} + 2t_{clad}} \quad (1)$$

In some embodiments, effective $10^{9.9}$ P temperature $T_{9.9P,eff}$ of glass article 100 is at most about 750° C., at most about 725° C., at most about 700° C., or at most about 675° C. Such a relatively low effective $10^{9.9}$ P temperature $T_{9.9P,eff}$ of glass article 100 can enable forming of the glass article into a shaped glass article having a desired 3D shape. For example, glass article 100 can be formed into a 3D shape at a forming temperature similar to the temperatures generally used for 3D forming of soda lime glass.

In various embodiments, a glass article can be used in applications in which strength, chemical durability, and/or formability are beneficial. For example, chemical durability can be beneficial for applications in which the glass will be used outdoors (e.g., automotive glass or architectural glass) or for other applications in which the glass article is likely to come into contact with potentially corrosive reagents such as acids or bases (e.g., laboratory benchtops). Strength and formability can be beneficial in these same applications to avoid breakage of the glass article and to enable the glass article to take on a variety of 3D shapes.

Conventional shaped glass articles generally are formed from soda lime glass. Thus, many forming industries (e.g., automotive glass or architectural glass forming industries) have equipment designed to form or mold soda lime glass. In some embodiments, a glass article (e.g., a laminated glass sheet) can be formed at temperatures similar to the temperatures used to form soda lime glass. Thus, the glass article can be formed on the same equipment conventionally used to form soda lime glass. The glass article can have chemical durability similar to that of soda lime glass and strength greater than that of soda lime glass at a lower thickness. Thus, the glass article can be used as a replacement for a similar soda lime glass article while providing increased strength and reduced weight (e.g., as a result of the reduced thickness).

Figure 3:
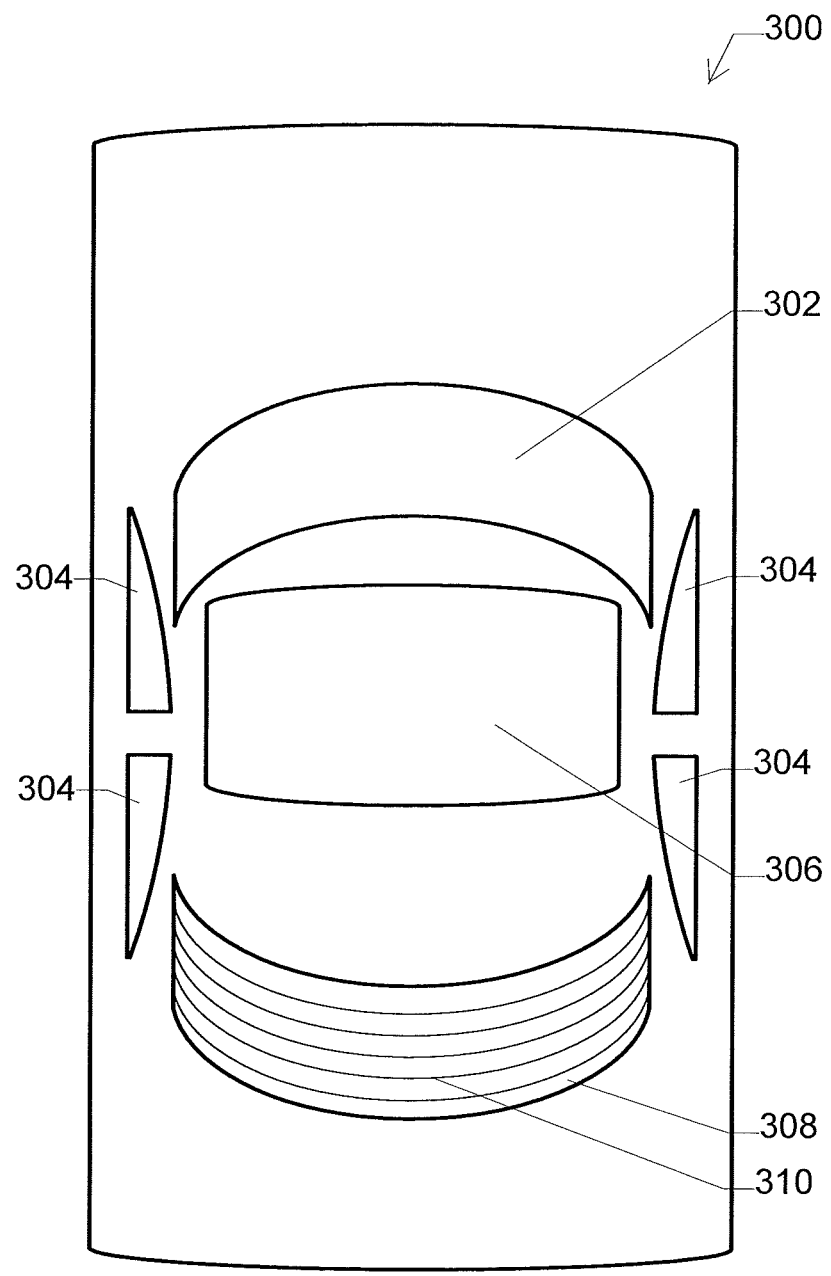
FIG. 3 is a schematic view of one exemplary embodiment of an automobile.

In some embodiments, an automotive glazing comprises glass article 100. FIG. 3 is a schematic view of one exemplary embodiment of an automobile 300. Automobile 300 can comprise an automotive glazing including, for example, a windshield, a sidelite (e.g., a door glass or a quarter window), a sun roof, a moon roof, a rear backlite, a lighting cover (e.g., a headlamp or taillamp cover), a mirror (e.g., a side mirror or a rearview mirror), an instrument panel or gauge cover, an interior or exterior panel (e.g., for a pillar or other applique), or another suitable glass or window. In the embodiment shown in FIG. 3, the automotive glazing comprises a windshield 302, door glass 304, a sun roof 306, and a rear backlite 308, any or all of which can comprise glass article 100.

In some embodiments, rear backlite 308 comprises glass article 100. Rear backlite 308 comprises a non-planar curved shape. For example, rear backlite 308 is curved to wrap around a rear portion of the passenger compartment of automobile 300. In some embodiments, rear backlite 308 comprises a pattern 310 printed on a surface thereof (e.g., an inside surface and/or an outside surface). For example, pattern 310 comprises a plurality of lines or curves, a grid, or another suitable pattern. In some embodiments, pattern 310 comprises a conductive pattern. For example, pattern 310 comprises a conductive ink or enamel that is applied to the surface of rear backlite 308 and then set (e.g., by curing or firing). Thus, pattern 310 can serve as a defroster or an antenna integrated into rear backlite 308.

In some embodiments, glass article 100 comprises a glass sheet. The glass sheet is contacted with a forming surface to form a shaped glass article. In some embodiments, the glass sheet is strengthened as described herein (e.g., by CTE mismatch). Additionally, or alternatively, the glass sheet is formable as described herein (e.g., by comprising a low effective $10^{9.9}$ P temperature $T_{9.9P,eff}$). In some embodiments, pattern 310 is printed on the glass sheet prior to contacting the glass sheet with the forming surface. For example, pattern 310 is printed on the glass sheet while the glass sheet is substantially planar, which can enable use of a variety of printing processes. In some embodiments, the printing process is selected from the group consisting of screen printing, flexographic printing, gravure printing, photo pattern printing, pad printing, and combinations thereof. The formability of the glass sheet enables forming of the glass sheet with the pattern printed thereon at a relatively low temperature (e.g., at or near effective $10^{9.9}$ P temperature $T_{9.9P,eff}$) to form the shaped glass article. Thus, the glass sheet is formable into the shaped glass article without damaging the pattern printed on the glass sheet. In some embodiments, the glass sheet is fired after the printing step and prior to or concurrent with the contacting step.

In some embodiments, other components of automobile 300 including, for example, light covers (e.g., for headlights, taillights, turn signals, or fog lights), mirrors (e.g., rearview mirror or sideview mirrors), or instrument covers can comprise glass article 100.

In some embodiments, a display (e.g., an LED or LCD display) comprises glass article 100. For example, the display comprises a cover glass comprising glass article 100. In some embodiments, the cover glass comprises an integrated cover glass and color filter. In some embodiments, the cover glass comprises an integrated touch cover glass.

In some embodiments, an architectural panel comprises glass article 100.

The first glass composition of core layer 102 and the second glass composition of first and/or second cladding layers 104 and 106 can comprise suitable glass compositions capable of forming a glass article with desired properties as described herein. Exemplary glass compositions and selected properties of the exemplary glass compositions are shown in Tables 1 and 2, respectively. The amounts of the various components are given in Table 1 as mol % on an oxide basis. The chemical durability data reported as "5% HCl, 95° C., 6 h (mg/cm$^2$)" was determined using the following procedure. A glass sample with a width of about 2.5 cm, a length of about 2.5 cm, and a thickness of about 0.05 cm to about 0.08 cm was soaked in Opticlear at 40° C. and rinsed with IPA. The glass sample was wiped with cheese cloth while rinsing with deionized water and then dried at 140° C. for at least 30 minutes. 200 mL of an aqueous 5% HCl solution was added to a preleached 250 ml FEP bottle and preheated for about 1-2 hours in an oven set at 95° C. The glass sample was leaned upright against the side wall of the bottle and allowed to soak for 6 hours at 95° C. About 15 mL of the resulting solution was poured into a centrifuge tube and reserved for ICP. The remainder of the solution was disposed of and the glass sample, still remaining in the bottle, was immediately quenched in deionized water. After quenching, the glass sample was retrieved from the bottle, rinsed in deionized water, and dried at 140° C. for at least 30 minutes. The weight loss of the glass sample was measured and the chemical durability was determined as weight loss per unit surface area. The chemical durability data reported as "1 M HNO$_3$, 95° C., 24 h (mg/cm$^2$)" was determined using the same procedure except that a 1 M HNO$_3$ solution was substituted for the HCl solution and the glass sample was allowed to soak in the acid solution for 24 hours as opposed to 6 hours. The chemical durability data reported as "0.2 N H$_2$SO$_4$, 95° C., 24 h (mg/cm$^2$)" was determined using the same procedure except that a 0.2 N H$_2$SO$_4$ solution was substituted for the HCl solution and the glass sample was allowed to soak in the acid solution for 24 hours as opposed to 6 hours.

In various embodiments, a glass article comprises a first layer (e.g., a core layer) comprising one of the exemplary glass compositions and a second layer (e.g., one or more cladding layers) comprising another of the exemplary glass compositions. The glass compositions of the first layer and the second layer are selected such that the glass article comprises strength, chemical durability, and/or formability properties as described herein. For example, the glass compositions of the first layer and the second layer are selected such that the glass article comprises a desired CTE mismatch. Additionally, or alternatively, the glass composition of the second layer is selected such that the glass article comprises a desired chemical durability. Additionally, or alternatively, the glass compositions of the first layer and the second layer are selected such that the glass article comprises a desired effective $10^{9.9}$ P temperature, or another desired effective viscosity temperature.

In some embodiments, the first glass composition comprises a glass network former selected from the group consisting of SiO$_2$, Al$_2$O$_3$, B$_2$O$_3$, P$_2$O$_5$, and combinations thereof. For example, the first glass composition comprises at least about 45 mol % SiO$_2$, at least about 50 mol % SiO$_2$, at least about 60 mol % SiO$_2$, at least about 70 mol % SiO$_2$, or at least about 75 mol % SiO$_2$. Additionally, or alternatively, the first glass composition comprises at most about 80 mol % SiO$_2$, at most about 75 mol % SiO$_2$, at most about 60 mol % SiO$_2$, or at most about 50 mol % SiO$_2$. Additionally, or alternatively, the first glass composition comprises at least about 5 mol % Al$_2$O$_3$, at least about 9 mol % Al$_2$O$_3$, at least about 15 mol % Al$_2$O$_3$, or at least about 20 mol % Al$_2$O$_3$. Additionally, or alternatively, the first glass composition comprises at most about 25 mol % Al$_2$O$_3$, at most about 20 mol % Al$_2$O$_3$, at most about 15 mol % Al$_2$O$_3$, or at most about 10 mol % Al$_2$O$_3$. Additionally, or alternatively, the first glass composition comprises at least about 1 mol % B$_2$O$_3$, at least about 4 mol % B$_2$O$_3$, or at least about 7 mol % B$_2$O$_3$. Additionally, or alternatively, the first glass composition comprises at most about 10 mol % B$_2$O$_3$, at most about 8 mol % B$_2$O$_3$, or at most about 5 mol % B$_2$O$_3$. Additionally, or alternatively, the first glass composition comprises at least about 2 mol % P$_2$O$_5$. Additionally, or alternatively, the first glass composition comprises at most about 5 mol % P$_2$O$_5$.

In some embodiments, the first glass composition comprises an alkali metal oxide selected from the group consisting of Li$_2$O, Na$_2$O, K$_2$O, and combinations thereof. For example, the first glass composition comprises at least about 5 mol % $Na_2O$, at least about 9 mol % $Na_2O$, or at least about 12 mol % $Na_2O$. Additionally, or alternatively, the first glass composition comprises at most about 20 mol % $Na_2O$, at most about 16 mol % $Na_2O$, or at most about 13 mol % $Na_2O$. Additionally, or alternatively, the first glass composition comprises at least about 0.01 mol % $K_2O$, at least about 1 mol % $K_2O$, at least about 2 mol % $K_2O$, or at least about 3 mol % $K_2O$. Additionally, or alternatively, the first glass composition comprises at most about 5 mol % $K_2O$, at most about 4 mol % $K_2O$, at most about 3 mol % $K_2O$, or at most about 1 mol % $K_2O$.

In some embodiments, the first glass composition comprises an alkaline earth oxide selected from the group consisting of MgO, CaO, SrO, BaO, and combinations thereof.

In some embodiments, the first glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$.

In some embodiments, the second glass composition comprises a glass network former selected from the group consisting of $SiO_2$, $Al_2O_3$, $B_2O_3$, and combinations thereof. For example, the second glass composition comprises at least about 65 mol % $SiO_2$, at least about 68 mol % $SiO_2$, at least about 70 mol % $SiO_2$, or at least about 75 mol % $SiO_2$. Additionally, or alternatively, the second glass composition comprises at most about 80 mol % $SiO_2$, at most about 77 mol % $SiO_2$, at most about 75 mol % $SiO_2$, or at most about 70 mol % $SiO_2$. Additionally, or alternatively, the second glass composition comprises at least about 1 mol % $Al_2O_3$, at least about 5 mol % $Al_2O_3$, or at least about 9 mol % $Al_2O_3$. Additionally, or alternatively, the second glass composition comprises at most about 15 mol % $Al_2O_3$, at most about 11 mol % $Al_2O_3$, at most about 5 mol % $Al_2O_3$, or at most about 3 mol % $Al_2O_3$. Additionally, or alternatively, the second glass composition comprises at least about 1 mol % $B_2O_3$, at least about 5 mol % $B_2O_3$, or at least about 9 mol % $B_2O_3$. Additionally, or alternatively, the second glass composition comprises at most about 20 mol % $B_2O_3$, at most about 16 mol % $B_2O_3$, or at most about 10 mol % $B_2O_3$.

In some embodiments, the second glass composition comprises an alkali metal oxide selected from the group consisting of $Li_2O$, $Na_2O$, $K_2O$, and combinations thereof. For example, the second glass composition comprises at least about 1 mol % $Na_2O$, or at least about 2 mol % $Na_2O$. Additionally, or alternatively, the second glass composition comprises at most about 15 mol % $Na_2O$, at most about 11 mol % $Na_2O$, or at most about 5 mol % $Na_2O$. Additionally, or alternatively, the second glass composition comprises from about 0.1 mol % to about 6 mol % $K_2O$, or from about 0.1 mol % to about 1 mol % $K_2O$. In some embodiments, the second glass composition is substantially free of alkali metal. For example, the second glass composition comprises at most about 0.01 mol % alkali metal oxide. In other embodiments, the second glass composition comprises from about 2 mol % to about 15 mol % alkali metal oxide.

In some embodiments, the second glass composition comprises an alkaline earth oxide selected from the group consisting of MgO, CaO, SrO, BaO, and combinations thereof. For example, the second glass composition comprises at least about 0.1 mol % MgO, at least about 1 mol % MgO, at least about 3 mol % MgO, at least about 5 mol % MgO, or at least about 10 mol % MgO. Additionally, or alternatively, the second glass composition comprises at most about 15 mol % MgO, at most about 10 mol % MgO, at most about 5 mol % MgO, or at most about 1 mol % MgO. Additionally, or alternatively, the second glass composition comprises at least about 0.1 mol % CaO, at least about 1 mol % CaO, at least about 3 mol % CaO, at least about 5 mol % CaO, or at least about 7 mol % CaO. Additionally, or alternatively, the second glass composition comprises at most about 10 mol % CaO, at most about 7 mol % CaO, at most about 5 mol % CaO, at most about 3 mol % CaO, or at most about 1 mol % CaO. In some embodiments, the second glass composition comprises from about 1 mol % to about 25 mol % alkaline earth oxide.

In some embodiments, the second glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$.

TABLE 1

Exemplary Glass Compositions

| | 1 | 2 | 3 | 4 | 5 | 6 | 7 |
|---|---|---|---|---|---|---|---|
| $SiO_2$ | 76.33 | 72.12 | 54.03 | 45.61 | 60.53 | 52.83 | 73.7 |
| $Al_2O_3$ | 7.17 | 9.15 | 15.92 | 21.37 | 12.35 | 17.01 | 6.83 |
| $B_2O_3$ | 4.05 | 4.16 | 8.13 | 7.07 | 1.99 | 5.2 | |
| $P_2O_5$ | | | 3.18 | 4.92 | 0.0244 | 2.517 | |
| $Na_2O$ | 12.18 | 9.88 | 14.7 | 15.73 | 13.94 | 14.839 | 12.01 |
| $K_2O$ | 0.01 | 2.53 | 3.62 | 0.006 | 3.67 | 1.752 | 2.74 |
| MgO | 0.01 | 0.03 | 0.0033 | 0.0055 | 0.6046 | 0.31 | 4.52 |
| CaO | 0.04 | 0.02 | 0.018 | 0.0246 | 0.0221 | 0.03 | |
| BaO | | | | 0.0013 | 0.0041 | | |
| ZnO | | 1.9 | 0.002 | 4.64 | 6.14 | 5.403 | |
| $SnO_2$ | 0.2 | 0.2 | 0.0367 | 0.3208 | 0.1453 | 0.308 | 0.19 |
| $ZrO_2$ | | | 0.0544 | 0.0334 | 0.0267 | 0.026 | |
| $CeO_2$ | | | 0.2179 | | | | |
| $MnO_2$ | | | 0.0003 | | | | |
| $TiO_2$ | | | 0.0085 | | 0.0035 | | |
| $Fe_2O_3$ | | | 0.0089 | 0.0081 | 0.009 | 0.008 | |
| $Sb_2O_3$ | | | 0.002 | 0.0782 | 0.0666 | 0.072 | |

| | 8 | 9 | 10 | 11 | 12 | 13 | 14 |
|---|---|---|---|---|---|---|---|
| $SiO_2$ | 78.67 | 77.9 | 77.4 | 77 | 76.6 | 77 | 77 |
| $Al_2O_3$ | 1.95 | 3.42 | 7 | 7 | 7 | 7 | 7 |
| $B_2O_3$ | 14.19 | 9.82 | | | | | |
| $P_2O_5$ | | | | | | | |
| $Na_2O$ | 3.64 | 7.01 | 10 | 10.2 | 10.4 | 5.3 | 10.4 |
| $K_2O$ | 0.01 | | 0.1 | 0.3 | 0.5 | 5.2 | 0.1 |
| MgO | 0.02 | 0.09 | 4.8 | 4.8 | 4.8 | 4.8 | 2.8 |
| CaO | 0.85 | 1.64 | 0.5 | 0.5 | 0.5 | 0.5 | 2.5 |
| BaO | 0.58 | | | | | | |
| ZnO | | | | | | | |
| $SnO_2$ | 0.07 | | 0.2 | 0.2 | 0.2 | 0.2 | 0.2 |
| $ZrO_2$ | | | | | | | |
| $CeO_2$ | | | | | | | |
| $MnO_2$ | | | | | | | |
| $TiO_2$ | | | | | | | |
| $Fe_2O_3$ | | | | | | | |
| $Sb_2O_3$ | | | | | | | |

| | 15 | 16 | 17 | 18 | 19 | 20 | 21 |
|---|---|---|---|---|---|---|---|
| $SiO_2$ | 77 | 77 | 77 | 77 | 76.5 | 76.5 | 75 |
| $Al_2O_3$ | 6.5 | 6.5 | 6.5 | 6.5 | 6.5 | 6.5 | 8 |
| $B_2O_3$ | | | | | | | |
| $P_2O_5$ | | | | | | | |
| $Na_2O$ | 10.7 | 11 | 10.4 | 9.8 | 8 | 7 | 6 |
| $K_2O$ | 0.1 | 0.1 | 0.1 | 0.1 | 0.1 | 0.1 | 0.1 |
| MgO | 2.5 | 2.7 | 3 | 3.3 | 4.5 | 5 | 5.5 |
| CaO | 3 | 2.5 | 2.8 | 3.1 | 4.2 | 4.7 | 5.2 |
| BaO | | | | | | | |
| ZnO | | | | | | | |
| $SnO_2$ | 0.2 | 0.2 | 0.2 | 0.2 | 0.2 | 0.2 | 0.2 |
| $ZrO_2$ | | | | | | | |
| $CeO_2$ | | | | | | | |
| $MnO_2$ | | | | | | | |
| $TiO_2$ | | | | | | | |
| $Fe_2O_3$ | | | | | | | |
| $Sb_2O_3$ | | | | | | | |

TABLE 1-continued

Exemplary Glass Compositions

| | 22 | 23 | 24 | 25 | 26 | 27 | 28 |
|---|---|---|---|---|---|---|---|
| $SiO_2$ | 70 | 72 | 68 | 70 | 72 | 68 | 70 |
| $Al_2O_3$ | 11 | 9 | 11 | 9 | 7 | 9 | 9 |
| $B_2O_3$ | | | | | | | |
| $P_2O_5$ | | | | | | | |
| $Na_2O$ | 5 | 5 | 5 | 5 | 5 | 5 | 3 |
| $K_2O$ | | | | | | | |
| MgO | 7 | 7 | 7 | 7 | 7 | 13 | 13 |
| CaO | 7 | 7 | 9 | 9 | 9 | 5 | 5 |
| BaO | | | | | | | |
| ZnO | | | | | | | |
| $SnO_2$ | 0.2 | 0.2 | 0.2 | 0.2 | 0.2 | 0.2 | 0.2 |
| $ZrO_2$ | | | | | | | |
| $CeO_2$ | | | | | | | |
| $MnO_2$ | | | | | | | |
| $TiO_2$ | | | | | | | |
| $Fe_2O_3$ | | | | | | | |
| $Sb_2O_3$ | | | | | | | |

| | 29 | 30 | 31 | 32 | 33 | 34 | 35 |
|---|---|---|---|---|---|---|---|
| $SiO_2$ | 72 | 68 | 70 | 72 | 68 | 68 | 70 |
| $Al_2O_3$ | 7 | 9 | 7 | 11 | 7 | 9 | 7 |
| $B_2O_3$ | | | | | | | |
| $P_2O_5$ | | | | | | | |
| $Na_2O$ | 3 | 3 | 3 | 5 | 3 | 1 | 1 |
| $K_2O$ | | | | | | | |
| MgO | 13 | 13 | 13 | 7 | 13 | 13 | 13 |
| CaO | 5 | 7 | 7 | 5 | 9 | 9 | 9 |
| BaO | | | | | | | |
| ZnO | | | | | | | |
| $SnO_2$ | 0.2 | 0.2 | 0.2 | 0.2 | 0.2 | 0.2 | 0.2 |
| $ZrO_2$ | | | | | | | |
| $CeO_2$ | | | | | | | |
| $MnO_2$ | | | | | | | |
| $TiO_2$ | | | | | | | |
| $Fe_2O_3$ | | | | | | | |
| $Sb_2O_3$ | | | | | | | |

TABLE 1-continued

Exemplary Glass Compositions

| | 36 | 37 | 38 | 39 | 40 | 41 | 42 |
|---|---|---|---|---|---|---|---|
| $SiO_2$ | 72 | 70 | 72 | 68 | 72 | 70 | 72 |
| $Al_2O_3$ | 11 | 11 | 9 | 11 | 11 | 11 | 9 |
| $B_2O_3$ | | | | | | | |
| $P_2O_5$ | | | | | | | |
| $Na_2O$ | 3 | 3 | 3 | 3 | 1 | 1 | 1 |
| $K_2O$ | | | | | | | |
| MgO | 7 | 7 | 7 | 13 | 7 | 13 | 13 |
| CaO | 7 | 9 | 9 | 5 | 9 | 5 | 5 |
| BaO | | | | | | | |
| ZnO | | | | | | | |
| $SnO_2$ | 0.2 | 0.2 | 0.2 | 0.2 | 0.2 | 0.2 | 0.2 |
| $ZrO_2$ | | | | | | | |
| $CeO_2$ | | | | | | | |
| $MnO_2$ | | | | | | | |
| $TiO_2$ | | | | | | | |
| $Fe_2O_3$ | | | | | | | |
| $Sb_2O_3$ | | | | | | | |

| | 43 | 44 | 45 |
|---|---|---|---|
| $SiO_2$ | 68 | 70 | 72 |
| $Al_2O_3$ | 11 | 9 | 7 |
| $B_2O_3$ | | | |
| $P_2O_5$ | | | |
| $Na_2O$ | 1 | 1 | 1 |
| $K_2O$ | | | |
| MgO | 13 | 13 | 13 |
| CaO | 7 | 7 | 7 |
| BaO | | | |
| ZnO | | | |
| $SnO_2$ | 0.2 | 0.2 | 0.2 |
| $ZrO_2$ | | | |
| $CeO_2$ | | | |
| $MnO_2$ | | | |
| $TiO_2$ | | | |
| $Fe_2O_3$ | | | |
| $Sb_2O_3$ | | | |

TABLE 2

Properties of Exemplary Glass Compositions

| | 1 | 2 | 3 | 4 | 5 | 6 | 7 |
|---|---|---|---|---|---|---|---|
| Softening Point (° C.) | 808.7 | 838 | 713.1 | 763.8 | 757.6 | 764.4 | 832 |
| CTE ($\times 10^{-7}$ ° $C.^{-1}$) | 66.7 | 74.3 | 93.1 | 88.7 | 89.8 | 91.3 | 84.3 |
| $10^{9.9}$ P Temp (° C.) | 658 | 668 | | | | | 687 |
| Liquidus Viscosity (kP) | 2662 | 7003 | >1000 | 7090 | | 2150 | |
| Liquidus Temp (° C.) | 885 | 900 | | | | | <740 |
| 35 kP Temp (° C.) | 1117 | 1201.4 | 967 | 1054 | 1051 | 1053 | 1152 |
| Chemical Durability | | | | | | | |
| 5% HCl, 95° C., 6 h ($mg/cm^2$) | 0.0004 | 0.0074 | | | | | |
| 1M $HNO_3$, 95° C., 24 h ($mg/cm^2$) | 0.01 | 0.0395 | | | | | 0.0089 |
| 0.2N $H_2SO_4$, 95° C., 24 h ($mg/cm^2$) | 0 | 0.0174 | | | | | 0.0015 |
| NIX | | | | | | | |

TABLE 2-continued

Properties of Exemplary Glass Compositions

ISO720
DIN12116
ISO695

| | 8 | 9 | 10 | 11 | 12 | 13 | 14 |
|---|---|---|---|---|---|---|---|
| Softening Point (° C.) | 800.9 | 785 | 964 | 951 | 939 | 989 | 914 |
| CTE ($\times 10^{-7}$ ° C.$^{-1}$) | 34.7 | | | | | | |
| $10^{9.9}$ P Temp (° C.) | 644 | | | | | | |
| Liquidus Viscosity (kP) | 6111 | | | | | | |
| Liquidus Temp (° C.) | 950 | | | | | | |
| 35 kP Temp (° C.) | 1124 | | | | | | |
| Chemical Durability | | | | | | | |
| 5% HCl, 95° C., 6 h (mg/cm$^2$) | 0.0003 | | | | | | |
| 1M HNO$_3$, 95° C., 24 h (mg/cm$^2$) | 0.023 | | | | | | |
| 0.2N H$_2$SO$_4$, 95° C., 24 h (mg/cm$^2$) | 0.005 | | | | | | |
| NIX ISO720 | | 31.9 | 46.2 | 46.2 | 42.1 | 42.1 | 48.3 |
| DIN12116 | | | −0.39 | −0.37 | −0.39 | −0.47 | −0.35 |
| ISO695 | | | −64 | −42 | −50 | −67 | −62 |

| | 15 | 16 | 17 | 18 | 19 | 20 | 21 |
|---|---|---|---|---|---|---|---|
| Softening Point (° C.) | 881 | 878 | 897 | 908 | 941 | 950 | 975 |
| CTE ($\times 10^{-7}$ ° C.$^{-1}$) | | | | | | | |
| $10^{9.9}$ P Temp (° C.) | | | | | | | |
| Liquidus Viscosity (kP) | | | | | | | |
| Liquidus Temp (° C.) | | | | | | | |
| 35 kP Temp (° C.) | | | | | | | |
| Chemical Durability | | | | | | | |
| 5% HCl, 95° C., 6 h (mg/cm$^2$) | | | | | | | |
| 1M HNO$_3$, 95° C., 24 h (mg/cm$^2$) | | | | | | | |
| 0.2N H$_2$SO$_4$, 95° C., 24 h (mg/cm$^2$) | | | | | | | |
| NIX ISO720 | 47.3 | 57.5 | 47.3 | 49.3 | 39 | 33.9 | 32.9 |
| DIN12116 | −0.48 | −0.28 | −0.43 | −0.35 | −0.4 | −0.55 | −0.48 |
| ISO695 | .53 | | −63 | −63 | −44 | | −66 |

| | 22 | 23 | 24 | 25 | 26 | 27 | 28 |
|---|---|---|---|---|---|---|---|
| Softening Point (° C.) | 969 | 963 | 944 | 941 | 935 | 936 | 971 |
| CTE ($\times 10^{-7}$ ° C.$^{-1}$) | 48.1 | 48.5 | 50.6 | 51.3 | 52.2 | 48.4 | 41.8 |
| $10^{9.9}$ P Temp (° C.) | | | | | | | |
| Liquidus Viscosity | | | | | | | |

TABLE 2-continued

Properties of Exemplary Glass Compositions (kP)
Liquidus
Temp (° C.)
35 kP
Temp (° C.)

Chemical Durability

5% HCl,
95° C., 6 h
(mg/cm$^2$)
1M HNO$_3$,
95° C., 24 h
(mg/cm$^2$)
0.2N
H$_2$SO$_4$,
95° C., 24 h
(mg/cm$^2$)

| NIX | 38.7 | 43.1 | 46 | 48.5 | 56.8 | 63.4 | 35.4 |

ISO720
DIN12116
ISO695

| | 29 | 30 | 31 | 32 | 33 | 34 | 35 |
|---|---|---|---|---|---|---|---|
| Softening Point (° C.) | 971 | 948 | 952 | 993 | 924 | 967 | 967 |
| CTE (×10$^{-7}$ ° C.$^{-1}$) | 42.8 | 45.4 | 44.7 | 44.7 | 65.7 | 41.2 | 40.9 |

10$^{9.9}$ P
Temp (° C.)
Liquidus
Viscosity
(kP)
Liquidus
Temp (° C.)
35 kP
Temp (° C.)

Chemical Durability

5% HCl,
95° C., 6 h
(mg/cm$^2$)
1M HNO$_3$,
95° C., 24 h
(mg/cm$^2$)
0.2N
H$_2$SO$_4$,
95° C., 24 h
(mg/cm$^2$)

| NIX | 38.2 | 47.1 | 45.6 | 28.9 | 58.3 | 39.2 | 40.9 |

ISO720
DIN12116
ISO695

| | 36 | 37 | 38 | 39 | 40 | 41 | 42 |
|---|---|---|---|---|---|---|---|
| Softening Point (° C.) | 1005 | 981 | 980 | 970 | 1021 | 1001 | 1009 |
| CTE (×10$^{-7}$ ° C.$^{-1}$) | 39.7 | 43.2 | 43.7 | 41.2 | 36.7 | 35.4 | 34.9 |

10$^{9.9}$ P
Temp (° C.)
Liquidus
Viscosity
(kP)
Liquidus
Temp (° C.)
35 kP
Temp (° C.)

Chemical Durability

5% HCl,
95° C., 6 h
(mg/cm$^2$)
1M HNO$_3$,
95° C., 24 h
(mg/cm$^2$)
0.2N

TABLE 2-continued

Properties of Exemplary Glass Compositions

| | | | | | | | |
|---|---|---|---|---|---|---|---|
| $H_2SO_4$, 95° C., 24 h (mg/cm$^2$) NIX ISO720 DIN12116 ISO695 | 25.8 | 34.4 | 33.1 | 41.2 | 23.5 | 24.7 | 27.3 |

| | 43 | 44 | 45 |
|---|---|---|---|
| Softening Point (° C.) | 988 | 987 | 991 |
| CTE (×10$^{-7}$° C.$^{-1}$) | 38.1 | 38.4 | 38.4 |
| 10$^{9.9}$ P Temp (° C.) | | | |
| Liquidus Viscosity (kP) | | | |
| Liquidus Temp (° C.) | | | |
| 35 kP Temp (° C.) | | | |

Chemical Durability

| | 43 | 44 | 45 |
|---|---|---|---|
| 5% HCl, 95° C., 6 h (mg/cm$^2$) | | | |
| 1M $HNO_3$, 95° C., 24 h (mg/cm$^2$) | | | |
| 0.2N $H_2SO_4$, 95° C., 24 h (mg/cm$^2$) NIX ISO720 DIN12116 ISO695 | 34.2 | 34.8 | 38.7 |

The glass articles described herein can be used for a variety of applications including, for example, for cover glass or glass backplane applications in consumer or commercial electronic devices including, for example, LCD and LED displays, computer monitors, and automated teller machines (ATMs); for touch screen or touch sensor applications, for portable electronic devices including, for example, mobile telephones, personal media players, and tablet computers; for integrated circuit applications including, for example, semiconductor wafers; for photovoltaic applications; for architectural glass applications; for automotive or vehicular glass applications; or for commercial or household appliance applications.

EXAMPLES

Various embodiments will be further clarified by the following examples.

Example 1

A glass sheet having the general configuration shown in FIG. 1 is formed. The glass sheet has a thickness of 2 mm. Each of the first cladding layer and the second cladding layer has a thickness of 200 μm and a compressive stress of 300 MPa. The core layer has a thickness of 1.6 mm and a tensile stress of 75 MPa.

Example 2

A glass sheet having the general configuration shown in FIG. 1 is formed. The glass sheet has a thickness of 0.7 mm. Each of the first cladding layer and the second cladding layer has a thickness of 200 μm and a compressive stress of 100 MPa. The core layer has a thickness of 300 μm.

Example 3

A glass sheet having the general configuration shown in FIG. 1 is formed. The core layer is formed from exemplary glass composition 1. Each of the first cladding layer and the second cladding layer is formed from exemplary glass composition 8.

Example 4

A glass sheet having the general configuration shown in FIG. 1 is formed. The core layer is formed from exemplary glass composition 2. Each of the first cladding layer and the second cladding layer is formed from exemplary glass composition 8.

Example 5

A glass sheet having the general configuration shown in FIG. 1 is formed. The core layer is formed from exemplary glass composition 7. Each of the first cladding layer and the second cladding layer is formed from exemplary glass composition 8. The glass sheet has a thickness of 1.5 mm. Each of the first cladding layer and the second cladding layer has a thickness of 188 μm and a compressive stress of 137 MPa. The core layer has a thickness of 1.124 mm and a tensile stress of 46 MPa.

Comparative Example 1

A monolithic soda lime glass sheet is formed. The glass sheet has a thickness of 3 mm. The glass sheet is thermally tempered, resulting in a compressive stress of 100 MPa.

Comparative Example 2

A monolithic ion exchangeable glass sheet is formed. The glass sheet has a thickness of 0.7 mm. The glass sheet is subjected to an ion exchange process, resulting in a compressive stress of 730 MPa and a depth of layer of 40 μm.

Figure 4:
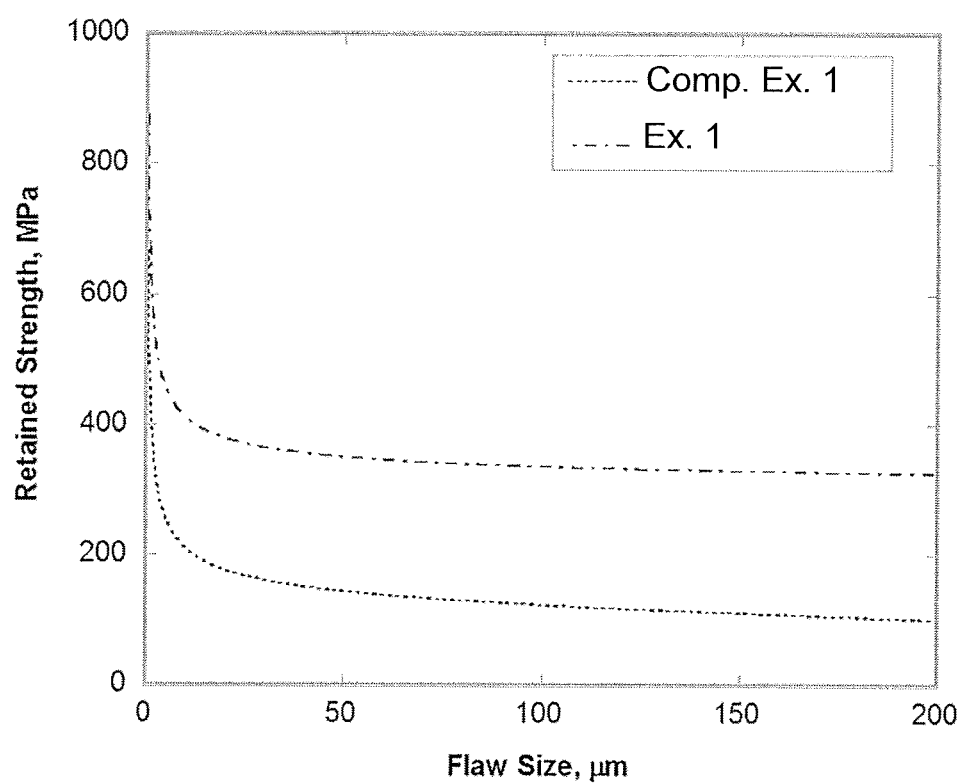
FIG. 4 is a graphical illustration of the predicted strength profiles of one exemplary embodiment of a glass article and an exemplary tempered glass sheet presented as retained strength.
Figure 5:
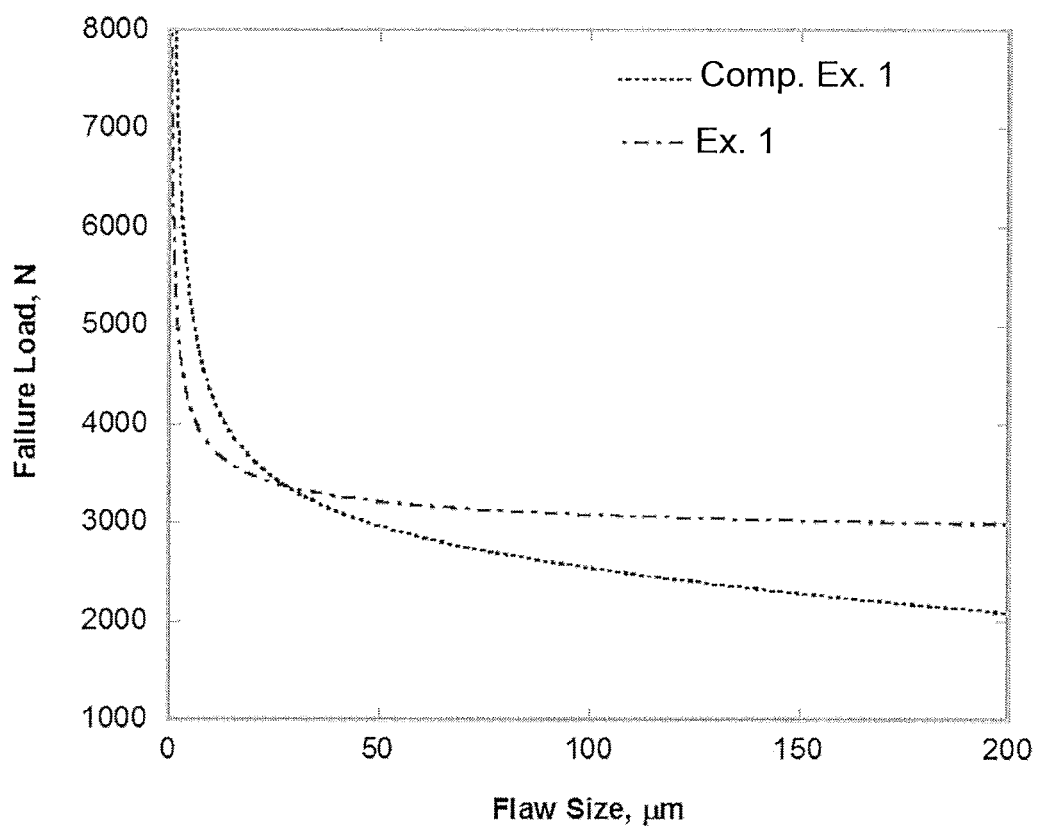
FIG. 5 is a graphical illustration of the predicted strength profiles of one exemplary embodiment of a glass article and an exemplary tempered glass sheet presented as failure load.

FIG. 4 is a graphical illustration of the predicted strength profiles of the glass sheets of Example 1 and Comparative Example 1 presented as retained strength, and FIG. 5 is a graphical illustration of the predicted strength profiles of the glass sheets of Example 1 and Comparative Example 1 presented as failure load. The strength values in failure load are predicted based on a model of ring-on-ring loading using a 1 in diameter support ring and a 0.5 in diameter loading ring on a 2 in square glass sheet. The contact radius of the ring is 1.6 mm, and the head speed is 1.2 mm/min.

As illustrated by FIGS. 4-5, the laminated glass sheet of Example 1 has improved strength profiles compared to the tempered glass sheet of Comparative Example 1, even though the laminated glass sheet is much less thick than the tempered glass sheet. The improved strength profile is evidenced by the higher retained strength and failure load values of the laminated glass sheet at increasing flaw sizes, indicating that the laminated glass sheet is able to withstand damage that may be inflicted during handling or use. Thus, the laminated glass sheet can be used as an in-kind replacement for the tempered glass sheet (e.g., for automotive glazing or other applications in which thermally tempered glass is currently used).

The laminated glass sheet has a reduced weight compared to the tempered glass sheet because of the reduced thickness of the laminated glass sheet compared to the tempered glass sheet. For example, the laminated glass sheet of Example 1 has a weight of from about 0.46 $g/cm^2$ to about 0.52 $g/cm^2$. In contrast, the tempered glass sheet of Comparative Example 1 has a weight of from about 0.69 $g/cm^2$ to about 0.78 $g/cm^2$. Thus, replacing the tempered glass sheet with the laminated glass sheet can reduce the weight of the glass by from about 24% to about 41%. In other embodiments, the weight can be reduced by nearly 100% (e.g., by using a 1.8 mm thick laminated glass sheet). In an automotive glazing application, such reduced weight can aid in reducing total vehicle weight, which can improve fuel efficiency, reduce $CO_2$ emissions, and improve vehicle handling.

Figure 6:
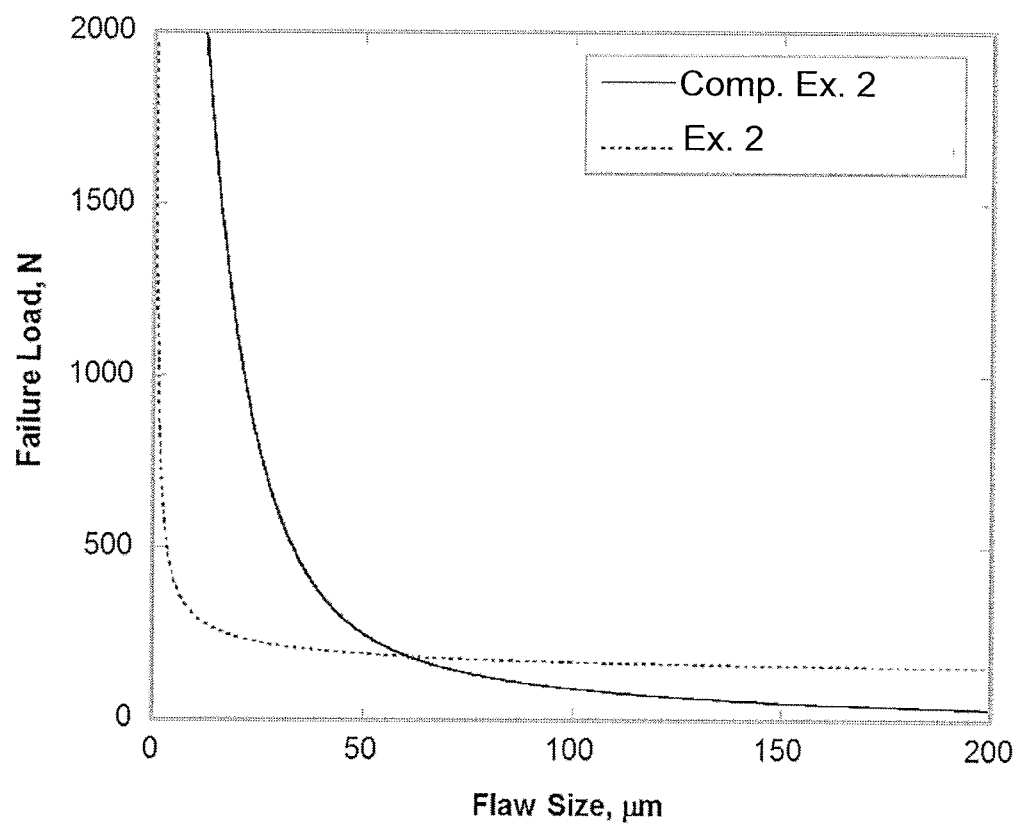
FIG. 6 is a graphical illustration of the predicted strength profiles of one exemplary embodiment of a glass article and an exemplary ion exchanged glass sheet presented as failure load.

FIG. 6 is a graphical illustration of the predicted strength profiles of the glass sheets of Example 2 and Comparative Example 2 presented as failure load. The strength values are predicted based on the same ring-on-ring loading model described with reference to FIGS. 4-5. As illustrated by FIG. 6, the laminated glass sheet of Example 2 has improved strength profiles compared to the ion exchanged glass sheet of Comparative Example 2, even though the laminated glass sheet has a significantly lower compressive stress than the ion exchanged glass sheet. The improved strength profile is evidenced by the relatively stable failure load value of the laminated glass sheet at increasing flaw sizes, indicating that the laminated glass sheet is able to withstand damage that may be inflicted during handling or use.

It will be apparent to those skilled in the art that various modifications and variations can be made without departing from the spirit or scope of the invention. Accordingly, the invention is not to be restricted except in light of the attached claims and their equivalents.

What is claimed is:

1. A method comprising:
contacting a glass sheet with a forming surface to form a shaped glass article, the glass sheet comprising a glass core layer and a glass cladding layer adjacent to the core layer;
wherein an average coefficient of thermal expansion (CTE) of the core layer is greater than an average CTE of the cladding layer, and an effective $10^{9.9}$ P temperature of the glass sheet is at most about 750° C.

2. The method of claim 1, further comprising printing a pattern on the glass sheet prior to the contacting step.

3. The method of claim 2, wherein the printing step comprises printing the pattern on the glass sheet using a printing process selected from the group consisting of screen printing, flexographic printing, gravure printing, photo-pattern printing, pad printing, and combinations thereof.

4. The method of claim 2, wherein the pattern comprises a conductive pattern.

5. The method of claim 2, wherein the pattern comprises at least one of an ink or an enamel.

6. The method of claim 2, wherein the glass sheet is substantially planar during the printing step.

7. The method of claim 2, further comprising firing the glass sheet after the printing step and prior to or concurrent with the contacting step.

* * * * *